United States Patent [19]

Feldmeier

[11] Patent Number: 4,881,518
[45] Date of Patent: Nov. 21, 1989

[54] APPARATUS FOR MANUFACTURING AND HANDLING THIN WAFERS

[75] Inventor: Fritz Feldmeier, Nuremberg, Fed. Rep. of Germany

[73] Assignee: GMN Georg Muller Nurnberg AG, Fed. Rep. of Germany

[21] Appl. No.: 266,790

[22] Filed: Nov. 3, 1988

[30] Foreign Application Priority Data

Nov. 5, 1987 [DE] Fed. Rep. of Germany ....... 3737540

[51] Int. Cl.⁴ ............................................. B28D 5/04
[52] U.S. Cl. ....................................... 125/14; 125/20; 29/56.5; 29/417; 29/56.6; 51/5 C; 51/121
[58] Field of Search ............... 29/417, 414, 56.5, 56.6; 51/5 C, 283 R, 110, 121; 125/13 R, 14, 20

[56] References Cited

U.S. PATENT DOCUMENTS

| 2,382,257 | 8/1945 | Ramsay. | |
|---|---|---|---|
| 3,154,990 | 11/1964 | Woods. | |
| 3,828,758 | 8/1974 | Cary | 125/13 R |
| 4,227,348 | 10/1980 | Demers | 125/13 R X |
| 4,228,782 | 10/1980 | Demers et al. | 125/14 |
| 4,407,262 | 10/1983 | Wirz et al. | 125/13 R |
| 4,420,909 | 12/1983 | Steere, Jr. | 51/283 R X |
| 4,663,890 | 5/1987 | Brandt | 51/283 R |
| 4,712,535 | 12/1987 | Fujisawa. | |
| 4,756,796 | 7/1988 | Saitou | 51/5 C X |

Primary Examiner—Mark Rosenbaum
Assistant Examiner—Peter Dungba Vo
Attorney, Agent, or Firm—Steinberg & Raskin

[57] ABSTRACT

Apparatus for manufacturing thin wafers from bars, such as in the manufacture of wafers for use as semiconductor substrates, include an arrangement wherein a holder member is fastened to the bar, the bar is sliced to separate a disc-shaped wafer therefrom and wherein prior to completion of the slicing operation, the end face of the bar is leveled to a precisely planar condition. The slicing operation is terminated after the bar is sliced completely through and the holder member is partially, but not completely, sliced through so that a wafer formed by the slicing operation remains connected to the bar by the holder member. The wafer is disconnected from the bar by abrading a portion of the holder member connecting the wafer to the bar.

5 Claims, 7 Drawing Sheets

APPARATUS FOR MANUFACTURING AND HANDLING THIN WAFERS

BACKGROUND OF THE INVENTION

This invention relates generally to methods and apparatus for manufacturing and handling thin wafers of hard, non-metallic material and, more particularly, to methods and apparatus for manufacturing and handling thin wafers of hard, non-metallic materials having at least one planar surface, such as are used as semiconductor substrates.

Reference is made to commonly owned U.S. applications Ser. No. 039,666 filed Apr. 16, 1987, now abandoned, and Ser. No. 191,682 filed May 9, 1988.

The production of extremely thin wafers or rounds of hard, non-metallic material is required in certain applications. For example, substrates for electronic components are formed from non-metallic, monocrystalline or polycrystalline materials, such as silicon or germanium arsenide, which are quite brittle and which have a Vickers hardness of up to about HV 15000 N/mm$^2$. The physical characteristics of such materials place great demands on machining processes.

Wafers for semiconductor substrates are conventionally manufactured by first producing a cylindrical bar or "billet" of the substrate material from a molten mass. The bar is then sliced transversely to its longitudinal axis, usually using internal hole or compass saws, to obtain discs whose surfaces are then ground to obtain the semiconductor wafers. However, it is difficult to produce wafers having precisely planar and parallel surfaces using such techniques. Another problem is the safe and efficient removal of the wafers from the manufacturing apparatus for further processing.

More particularly, the cutting or slicing tool tends to migrate or deviate from its intended path during conventional slicing operations under the influence of the various forces which act on the tool during the processing and due to wear and tear on the tool. The deflection of the tool during slicing results in a non-uniformity in the geometry of the disc and, in particular, the surfaces of the disc produced are neither planar nor parallel to each other. Rather, the surfaces of the disc are formed with a "twist" generally referred to as a "bow" or "warp".

Figure 1:
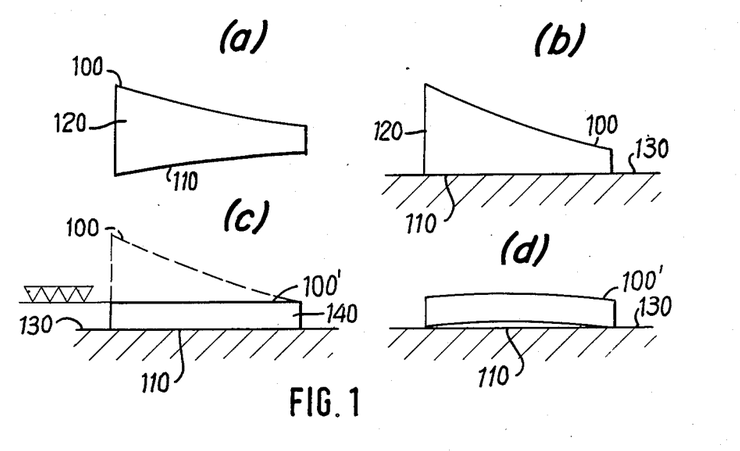
FIGS. 1(a)–1(d) are schematic views illustrating a prior art technique for manufacturing thin wafers of hard, non-metallic material.

A disc or wafer 120 manufactured according to conventional techniques is illustrated in FIG. 1(*a*) (in exaggerated form). It is seen from FIGS. 1(*b*) and 1(*d*) that even further processing steps cannot correct the "out-of-plane" errors in disc 120. The surfaces 100 and 110 of disc 120 manufactured by slicing from a cylindrical bar in accordance with conventional techniques are slightly bowed as seen in FIG. 1(*a*) due to deviation of the cutting or slicing tool from its intended path. When the thin disc 120 is clamped by suction onto a planar clamping plate 130 for further processing to correct the bow or warp, the surface 110 engaging the clamping plate 130 becomes planar (FIG. 1(*b*)) due to the slight elasticity of the material of disc 120 which can be referred to as a workpiece. This elastic deformation, however, sets up a pre-stress in the clamped workpiece. The free surface 100 is then machined by any conventional planing process to a planar surface 100' (FIG. 1(*c*)) to produce the wafer 140. However, when the wafer 140 is released from clamping plate 130, the surface 110 of the wafer facing the clamping plate 130 assumes its original form as seen in FIG. 1(*d*) under the effect of the pre-stress set up in the workpiece when it is initially clamped to the plate and since the wafer is extremely thin. This bowing of the surface cannot be corrected in subsequent processing steps. Moreover, even if the wafer 140 is then turned over, clamped to plate 130 with surface 100' being flexed into a planar condition, and surface 110 then planed, a bowing would still exist when the wafer is released. It is seen from the foregoing that although it is possible to obtain a wafer having parallel surfaces, e.g., surfaces 100' and 110 are parallel to each other, it is not possible to obtain precisely planar surfaces according to conventional techniques.

The problem of obtaining precisely planar and parallel wafer surfaces is solved by the technique disclosed in above-mentioned abandoned application Ser. No. 039,666 through a method illustrated in FIG. 2 wherein the slicing and planing steps are integrated.

Figure 2:
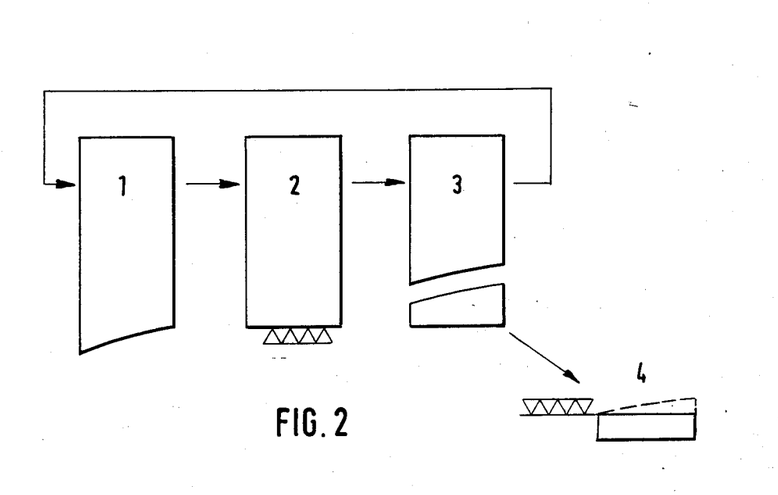
FIG. 2 is a schematic view illustrating certain of the steps of a method in accordance with the invention for manufacturing wafers of hard, non-metallic material.

Referring to FIG. 2, the uneven end face 200*a* (stage 1) of bar 4 remaining from a previous slicing operation is planed, such as by a grinding process, to a precisely planar condition (stage 2), the new planar face of the bar being designated 200*b*. It is understood that other planing processes than grinding can be employed, such as milling, turning, and electrolytic and errosive abrasion. A disc or workpiece 24 is then formed (stage 3) by slicing the bar in the conventional manner, such as by using an internal hole or compass saw. The resulting disc 24 thus has an uneven surface 200*c* (due to deviation of the cutting tool during the slicing operation) and the precisely planar surface 200*b*. However, since the sliced workpiece has the one precisely planar surface 200*b*, it can be clamped onto a planar clamping plate without any elastic distortion. Thus, the workpiece 24 is then clamped to a planar clamping plate with its planar reference surface 200*b* engaging the plate whereupon the opposite surface 200*c* is then machined to a planar condition 210 parallel to the already planed surface 200*b* engaging the clamping plate to produce the wafer (stage 4). When the wafer is released from the clamping plate, it no longer elastically deforms since there are no pre-stresses set up in the workpiece when it is initially clamped to the plate. The process is repeated as indicated by arrow 212, i.e., the newly formed end face 200*a* of the bar is then planed, etc. in the manufacture of additional wafers.

It is immaterial in the manufacturing operation whether the severing or slicing and grinding processes are performed to form a surface perpendicular to the axis of the bar or a surface which is slightly oblique to the bar axis.

The integration of the severing or slicing and grinding operations requires a suitable combination of known types of slicing and grinding machines.

For example, apparatus for performing the integrated slicing and grinding operations may comprise a combination of a compass or internal hole saw and a grinding machine. In this connection, apparatus which can perform the grinding or planing of the end face of the bar or billet as well as the slicing of the disc simultaneously with each other in one operation is desired for purposes of reducing the time required for the operation.

Figure 3:
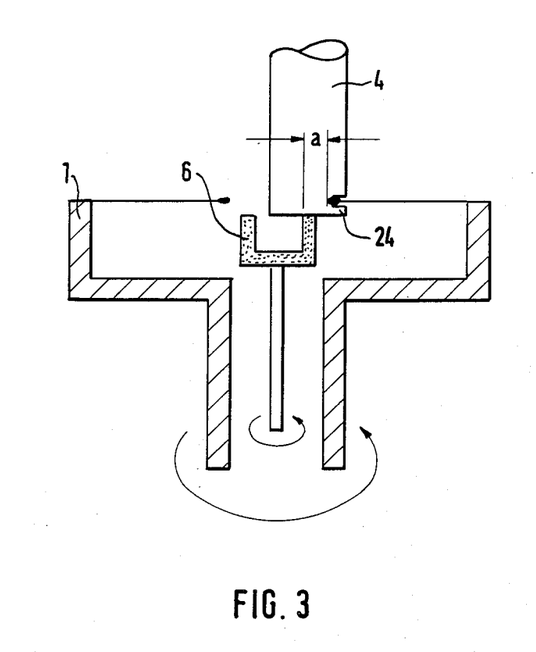
FIG. 3 is a schematic elevation view illustrating an embodiment of apparatus which can be adapted for performing a method in accordance with the invention.

One example of apparatus capable of performing the planing and slicing operations at the same time is illustrated in FIG. 3. To permit grinding or planing during the slicing operation, the working edge of the grinding disc 6 is set back radially by a distance "a" behind the cutting edge 5 of the saw blade. Since the disc or wafer 24 has not as yet been severed from the bar 4 in the zone of engagement of the grinding wheel 6, the conditions for a distortion-free planing of a reference face in accordance with the method described above are satisfied.

It is thus possible using the apparatus shown in FIG. 3 to produce wafers with one precisely planar surface so that, if desired, the second surface of the wafer can be subsequently machined by grinding to a precisely planar condition parallel to the first surface.

However, considerable problems exist in the use of apparatus of the type illustrated in FIG. 3 with respect to handling the wafer produced, i.e., in removing the wafer from the bar for further processing.

In particular, during the last phase of slicing by the saw blade of the compass saw, considerable wafer breakage occurs. Additionally, removal of the severed wafer through the inner hole of the saw blade is often difficult due to the narrow space available and the required arrangement of the grinding tool with respect to the saw blade. The removal of the wafer becomes more difficult as the diameter of the wafer increases.

SUMMARY OF THE INVENTION

It is an object of the present invention to provide new and improved methods and apparatus for manufacturing wafers having at least one planar surface.

Another object of the present invention is to provide new and improved methods and apparatus for manufacturing wafers having at least one planar surface which avoid the drawbacks of conventional methods and apparatus.

Briefly, in accordance with the present invention, these and other objects are obtained by providing an arrangement for manufacturing thin wafers of hard, non-metallic material, such as monocrystalline or polycrystalline material for use as semiconductor substrates, from bars of such materials, wherein a holder member is fastened to a bar of the material whereupon the bar is sliced to separate a disc-shaped wafer therefrom while prior to at least the completion of the slicing operation, the end face of the bar is leveled to a precisely planar condition. In accordance with the invention, the slicing operation is terminated after the bar is sliced through completely and the holder member is partially, but not completely, sliced through so that a wafer formed by the slicing operation remains connected to the bar by the holder member. The wafer is then disconnected from the bar by abrading at least the portion of the holder member that connects the wafer to the bar. The arrangement preferably comprises an internal hole or compass saw within the structure of which an abrasion device, such as a cup-shaped grinding wheel, is mounted for both planing the end face of the bar and abrading the holder member to disconnect the wafer from the bar. A take-off plate is mounted within the cup-shaped grinding wheel.

The grinding wheel and compass saw preferably form an integrated unit.

DESCRIPTION OF THE DRAWINGS

A more complete appreciation of the present invention and many of the attendant advantages thereof will be readily understood by reference to the following detailed description when considered in connection with the drawings illustrative of preferred embodiments of the invention, and wherein.

DESCRIPTION OF THE PREFERRED EMBODIMENTS

Figure 5:
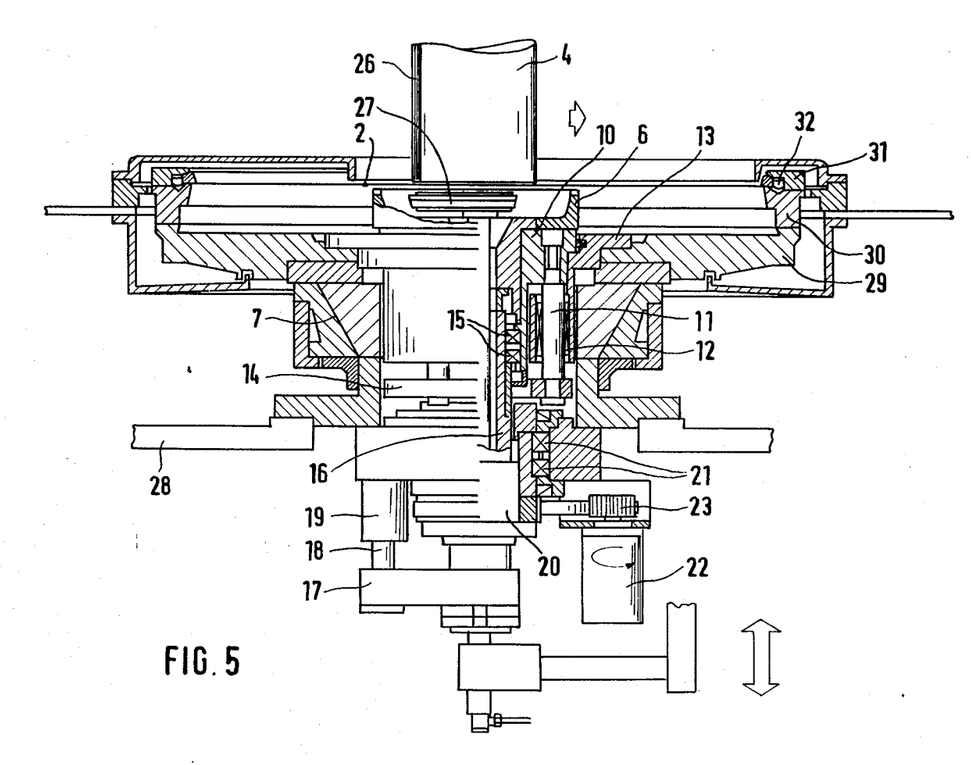
FIG. 5 is a front elevation view in partial section of a part of the apparatus illustrated in FIG. 4 for performing a method in accordance with the invention.

Referring now to the drawings wherein like reference characters designate identical or corresponding parts throughout the several views, and more particularly to FIG. 5, apparatus in accordance with the invention for performing a method in accordance with the invention comprises a rotatable spindle 7 mounted on a fixed machine frame 28 through several intermediate members. A pneumatic bearing spindle having conical and planar active faces is used in the illustrated embodiment. It is understood, however, that other types of spindles, such as rolling, sliding, fluid or magnetic-mounted spindles, may be used. The spindle 7 carries both a cup-shaped grinding wheel 6 and a saw head 1 including a dish-like rotor 29, a lower chuck ring 30, an upper chuck ring 31 and a clamping head 32 in which the saw blade 2 having an inner peripheral edge is mounted.

Protective housing members 41 and 42 surround the saw head 1 and are fixed to the stationary frame 28 to protect the saw head as well as to facilitate the flow of cooling fluids and removal of chips formed during the sawing operation.

The rotatable saw head 1 is fixed both radially and axially. On the other hand, the grinding wheel 6 can be axially raised to an operating position or lowered to a standby position. Grinding wheel 6 is mounted on a flange of a grinding wheel holder 10 which, in turn, is mounted for axial movement on a fixed shaft 16. The grinding wheel holder 10 is axially displaceable by means of guide bolts 11 and ball guides 12 relative to an intermediate member 13 connected to the saw head 1. In order to ensure that the three guide bolts 11 remain parallel to each other to preserve the precision of the entire guide arrangement, the free ends of each of the guide bolts are joined to each other by means of a ring 14.

Figure 4:
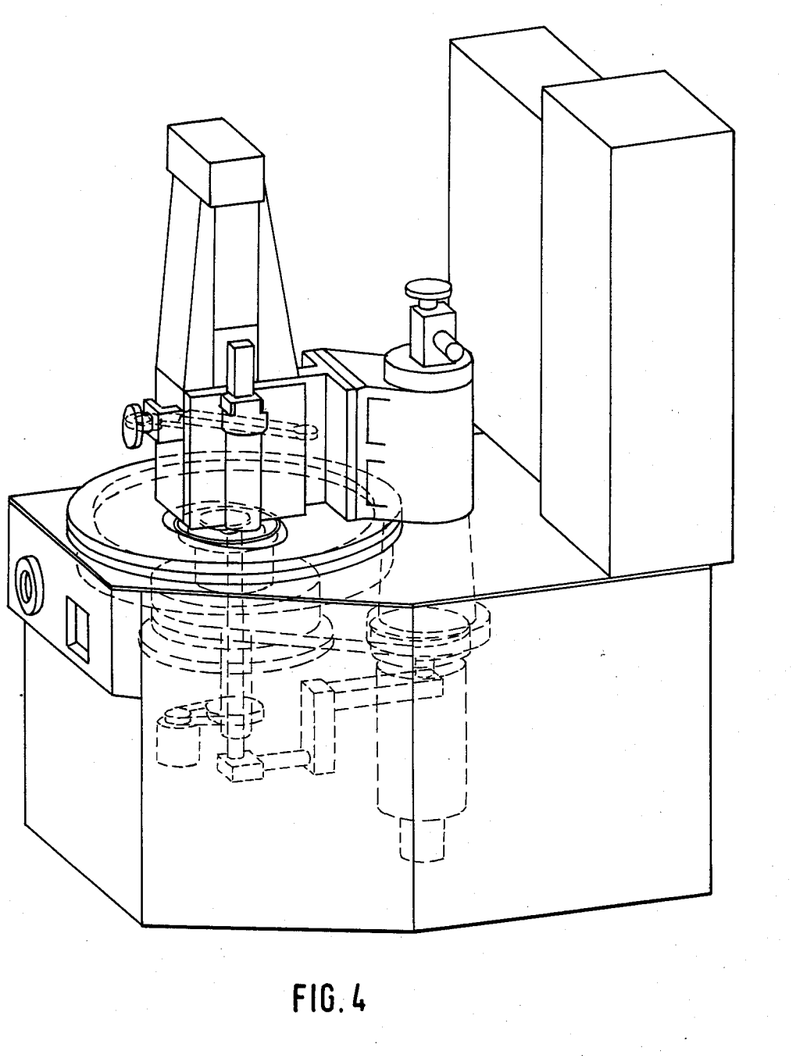
FIG. 4 is an overall perspective view of apparatus in accordance with the invention for performing a method in accordance with the invention.

As mentioned above, the rotating grinding wheel holder 10 is mounted for axial movement on the fixed hollow shaft 16 by means of a pair of ball bearings 15. To this end the hollow shaft 16 is connected to a supporting lever 17 at its lower end. A bolt 18 extending from a stationary ball guide 19 is connected to the lever 17 so that although the shaft 16 is fixed against rotation, it is moveable in the axial direction. The axial movement of the shaft 16, and accordingly, the axial movement of the grinding wheel 6, is caused by the rotation of a nut 20 threadedly fastened to hollow shaft 16. The nut 20 is mounted on the stationary frame by a pair of ball bearings 21 and corresponding intermediate members so that the nut 20 can be rotated but not displaced in the axial direction. Nut 20 is rotated by means of a servo motor 22 coupled to nut 20 through a toothed belt 5 and cooperating gear 23. The bar or billet 4 is mounted in an assembly 43 (FIG. 4) so that its end extends into the region of the opening in the internal hole saw blade 2. The mounting assembly 43 is moveable in the radial direction as well as in the axial direction during operation as described below.

The operation of the apparatus in the manufacture of thin wafers in accordance with the invention will now be described with reference to FIGS. 6–10. Generally, each wafer is formed by slicing the bar 4 with the saw blade 2 and, prior to completing the slicing operation, leveling or planing the end surface of the bar to a precisely planar condition. In the illustrated embodiment, the leveling operating is done simultaneously with the slicing operation.

Figure 6:
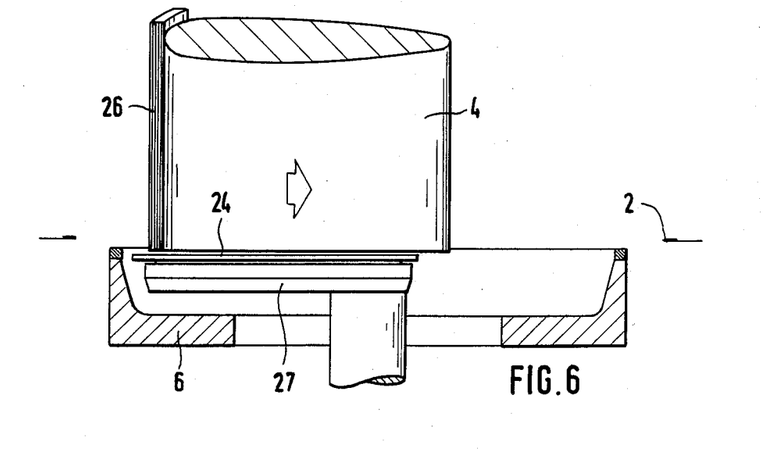
FIGS. 6–10 are schematic views illustrating a sequence of steps in a method in accordance with the invention.
Figure 7:
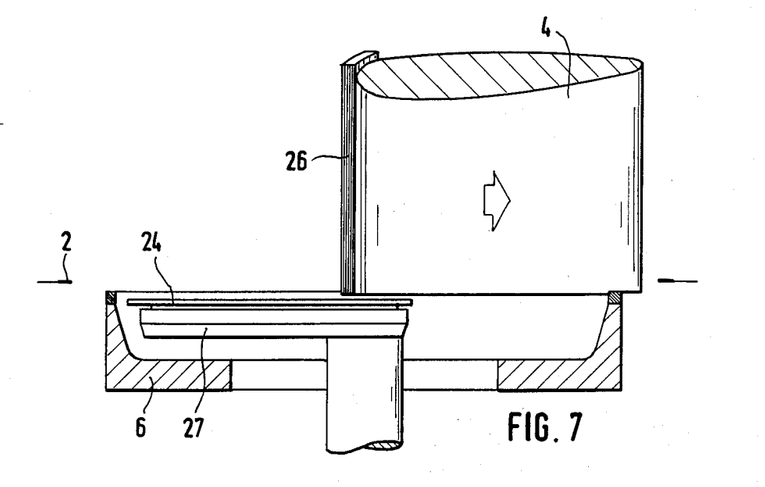
Figure 8:
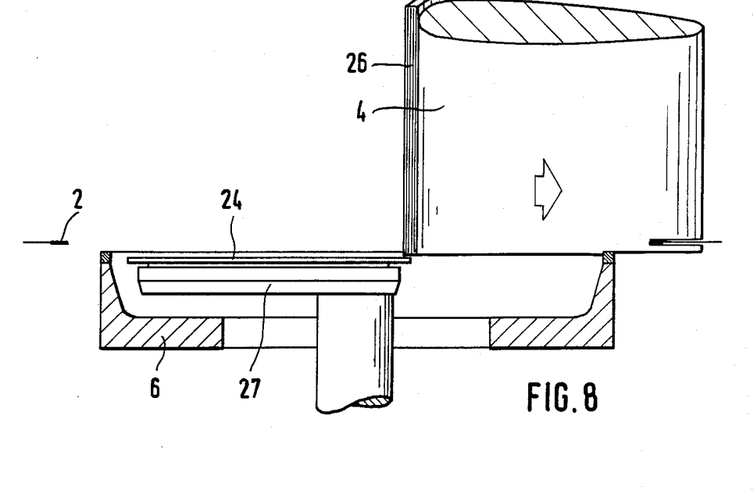

At the beginning of each slicing operation, the end of bar 4 is situated within the opening of the cup-shaped grinding tool 6 as seen in FIG. 6. The end of bar 4 protrudes axially beyond the plane of the saw blade 2 by an amount substantially equal to the thickness of the wafer being manufactured. The bar 4 is then fed in the radial direction, i.e. in the direction of the arrow in Fig. 6, whereupon it comes into engagement with the peripheral grinding means, i.e., the top and inner working surfaces 6a and 6b, of the grinding wheel 6 (FIG. 7) which are situated at the open region defined by the inner peripheral blade edge. The axial position of bar 4 relative to the grinding wheel 6 is fixed prior to initiation of the feed movement so that the grinding wheel abrades only the small amount of the end surface of bar 4 which is necessary to achieve the required planarity of the wafer surface. As the feed of bar 4 continues, the edge of saw blade 2 engages bar 4 (FIG. 8) whereupon the surface grinding performed by grinding wheel 6 and the severing or slicing operation performed by saw blade 2 take place simultaneously using the common feed movement of bar 4.

After the feed movement of bar 4 has progressed to a point where the grinding surfaces of grinding wheel 6 are no longer in engagement with the end face of bar 4, the grinding wheel 6 is lowered to its standby position to avoid contact between its abrasive coating and the wafer when the bar or billet undergoes a return movement. At the same time, a wafer 24', previously separated from the bar during the preceding slicing operation and being held on a take-off plate 27 situated within the cup-shaped grinding wheel, is removed from the apparatus by means of a transfer arm 25 through the open region defined by the inner peripheral blade edge of the compass saw blade 2 which is now completely unobstructed by virtue of the movement of bar 4 to the position shown in FIG. 9.

Figure 9:
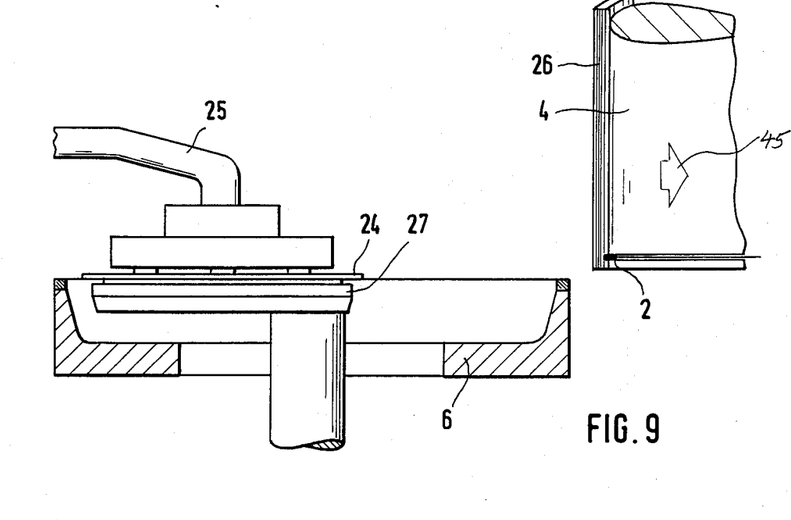

The feed movement designated by arrow 45 in FIG. 9 and the slicing of the bar 4 continues until the bar is completely severed and disc-shaped wafer 24 has been separated from the bar. At this point, the saw blade 2 engages and cuts into a holder member including an auxiliary strip 26 made, for example, of carbon or ceramic. The auxiliary strip 26 has been previously glued to bar 4 so as to extend longitudinally along the bar 4 at least from the end face thereof. Thus, the slicing operation being performed by the saw blade 2 is terminated after the bar 4 has been sliced through completely and after the auxiliary strip 26 has been partially sliced through, but prior to the auxiliary strip 26 being sliced through completely. In this manner, the wafer 24 formed, i.e., separated from the bar 4, by the slicing operation remains connected to the bar 4 by means of the auxiliary strip 26.

Figure 10:
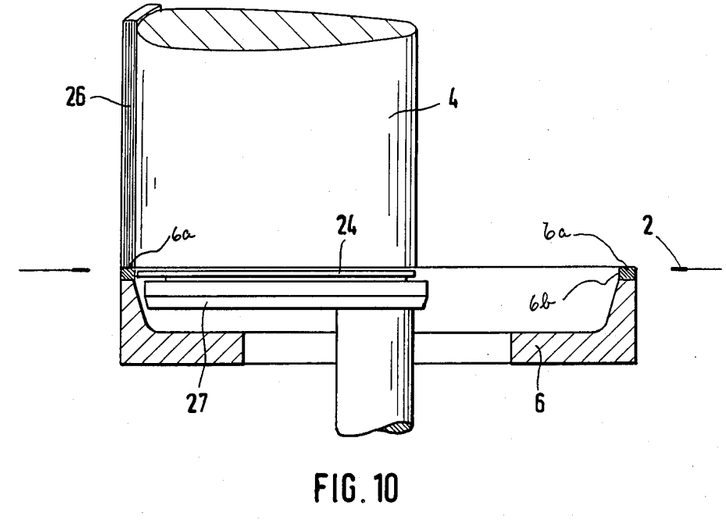

The bar with the wafer 24 retained thereto by means of the auxiliary strip 26 which has been glued to the surface of the bar, is then returned in a direction opposite to its feed direction in a rapid manner until reaching a rear end position where the auxiliary strip 26 is situated directly over the top peripheral working surface 6a of grinding wheel 6 (FIG. 10). The width of the top working surface 6a of grinding wheel 6 must be at least large enough to cover the total cross-sectional area of the auxiliary strip 26.

At this point, the grinding wheel 6 and bar 4 are moved axially towards each other until the top peripheral working surface 6a of grinding wheel 6 engages the auxiliary strip 26. The lower portion of the auxiliary strip 26 holding the wafer 24 to the bar 4 is abraded until the wafer 24 is connected from the bar 4 whereupon it comes to rest on the take-off plate 27 which is positioned immediately below the wafer in the space defined by the cup-shaped grinding wheel. The wafer is securely retained to the plate 27 by means of a vacuum. The take-off plate 27 and the wafer 24 retained thereon are moved a short lateral distance away from the inner working surface 6b of grinding tool 6 to avoid any possibility of contact between the newly formed wafer 24 and the grinding tool 6. The position of take-off plate 27 can be adjusted in the axial direction in accordance with the thickness of the particular wafer through suitable setting devices. The extent to which the grinding wheel 6 is moved in the axial direction (upward in FIG. 10) can be controlled so that its final position is suitable for leveling the new end face of the bar 4 in conjunction with a following slicing operation.

The severing of the auxiliary strip can also be accomplished by advancing the auxiliary strip in the radial direction relative to the grinding wheel 6. The return stroke movement of the bar will in this case end just before the inner peripheral working surface 6b of the grinding wheel so that the bar 4 and wafer 24 can be lowered axially into the cup-shaped grinding wheel to an extent such that the wafer 24 to be severed from the auxiliary strip becomes positioned adjacent to the inner working surface 6b of grinding wheel 6 just far enough that the top working surface 6a of grinding wheel 6 is positioned in a plane in position for planing the next wafer formed.

As the bar 4 is moved in a direction opposite to the direction of its feed movement, the auxiliary strip 26 is abraded from its rear side until the wafer 24 is disconnected from the bar and comes to rest on the take-off plate 27.

After the wafer has been finally disconnected from the bar by abrading the portion of the auxiliary strip connecting it to the bar, the grinding wheel 6 and take-off plate 27, along with the wafer 24 carried on the plate 27, are moved into their initial positions preparatory to the next slicing operation as seen in Fig. 6. In the case of very thin wafers, the take-off plate 27 can, if required, be lowered in the axial direction further into the interior of the cup-shaped grinding wheel 6 in order to reliably avoid the possibility that the following steps in connection with forming a new wafer might result in contact with the just formed wafer 24.

In summary, the auxiliary strip 26 constitutes a holder member which is fastened to the bar 4 and extends longitudinally along the bar 4 at least from its end face. The bar 4 is sliced by saw blade 2 to separate a disc-shaped wafer 24 from the bar. The slicing operation is terminated after the bar 4 is completely sliced through and after the holder member has been partially, but not completely, sliced through. In this manner, a wafer 24 formed by the slicing operation remains connected to the bar by means of the holder member 26. Prior to completing the slicing operation, the end face of the bar 4 is leveled by means of the grinding tool 6 to a precisely planar condition. The wafer 24 is finally disconnected from the bar 4 by abrading a portion of the holder member or auxiliary strip 26 connecting the wafer to the bar. In the illustrated apparatus, the same grinding tool planes the bar end face and disconnects the wafer from the bar.

Obviously, numerous modifications and variations of the present invention are possible in the light of the above teachings. It is therefore to be understood that within the scope of the claims appended hereto, the invention may be practiced otherwise than as specifically disclosed herein.

What is claimed is:

1. Apparatus for manufacturing thin wafers of hard, non-metallic material, such as monocrystalline or polycrystalline material for use as semiconductor substrates, from a bar of such material, said wafers having at least one substantially precisely planar surface, comprising:

internal hole saw means including a blade having an inner peripheral blade edge for slicing said bar to separate a disc-shaped wafer therefrom having a first surface constituted by an end face of said bar, said inner peripheral blade edge defining an open region of said saw means;

a substantially cup-shaped grinding wheel having peripheral grinding means situated at said open region of said inner blade edge for grinding said end face of said bar to a substantially precisely planar condition prior to completion of said slicing by said saw means;

means associated with said saw means for holding said bar during said slicing, said holding means including a holder member fastened to a side surface of said bar extending longitudinally at least from said end face thereof, said holder member adapted to be partially, but not completely, sliced through by said saw means after a wafer is separated from said bar by said saw means so that a portion of said holder member connects said separated wafer to said bar;

said peripheral grinding means of said cup-shaped grinding wheel comprises means for abrading said portion of said holder member connecting said separated wafer to said bar to disconnect said wafer from said bar;

take-off plate means situated substantially within said cup-shaped grinding wheel for receiving and holding said separated wafer after said separated wafer has been disconnected from said bar by said peripheral grinding means of said cup-shaped grinding wheel; and transfer arm means for picking up a wafer from said take-off plate means and transferring it for subsequent processing.

2. Apparatus in accordance with claim 1 wherein said take-off plate means comprises a plate situated substantially within said space defined by said cup-shaped grinding wheel and means for coupling a surface of said take-off plate to a source of suction for holding a wafer disconnected from said bar to said take-off plate.

3. Apparatus in accordance with claim 1 further including means for adjusting the position of said take-off plate means within said cup-shaped grinding wheel in both the axial and radial directions relative to said grinding wheel.

4. Apparatus as recited in claim 1 wherein said means for holding said bar during said slicing comprises means for moving said bar after said slicing to a holder portion grinding position wherein said portion of said holder means connecting said separated wafer to said bar is contiguous with said peripheral grinding means of said cup-shaped grinding wheel and wherein said take-off plate means are situated in opposed relationship to said separated wafer when said bar is situated in said holder portion grinding position.

5. Apparatus in accordance with claim 1 further including means for moving said bar on the one hand with respect to said saw means and grinding wheel on the other hand during said slicing and grinding to positions at which said bar is in non-overlying relationship with said take-off plate means so that said transfer arm means can transfer a wafer from said take-off plate means during said slicing and grinding.

* * * * *